(12) United States Patent
Leturcq

(10) Patent No.: US 11,391,872 B2
(45) Date of Patent: Jul. 19, 2022

(54) INFRARED REFLECTIVE AND ELECTRICAL CONDUCTIVE COMPOSITE FILM AND MANUFACTURING METHOD THEREOF

(71) Applicant: LUXEMBOURG INSTITUTE OF SCIENCE AND TECHNOLOGY (LIST), Esch-sur-Alzette (LU)

(72) Inventor: Renaud Leturcq, Luxembourg (LU)

(73) Assignee: LUXEMBOURG INSTITUTE OF SCIENCE AND TECHNOLOGY (LIST), Esch-sur Alzette (LU)

( * ) Notice: Subject to any disclaimer, the term of this patent is extended or adjusted under 35 U.S.C. 154(b) by 282 days.

(21) Appl. No.: 16/476,563

(22) PCT Filed: Jan. 9, 2018

(86) PCT No.: PCT/EP2018/050479
§ 371 (c)(1),
(2) Date: Jul. 9, 2019

(87) PCT Pub. No.: WO2018/130530
PCT Pub. Date: Jul. 19, 2018

(65) Prior Publication Data
US 2019/0353834 A1 Nov. 21, 2019

(30) Foreign Application Priority Data
Jan. 11, 2017 (LU) .......... 100018

(51) Int. Cl.
G02B 5/26 (2006.01)
G02B 5/20 (2006.01)

(52) U.S. Cl.
CPC .......... *G02B 5/208* (2013.01); *G02B 5/204* (2013.01); *G02B 5/26* (2013.01)

(58) Field of Classification Search
None
See application file for complete search history.

(56) References Cited

U.S. PATENT DOCUMENTS

2011/0250437 A1* 10/2011 Fun .......... B22F 7/04
428/328
2011/0268941 A1 11/2011 Fischer et al.
(Continued)

FOREIGN PATENT DOCUMENTS

EP 2374559 A2 10/2011
JP 2013068945 A * 4/2013 .......... G02B 5/206
(Continued)

OTHER PUBLICATIONS

International Search Report for corresponding PCT/EP2018/050479, dated Mar. 12, 2018.
(Continued)

*Primary Examiner* — Derek S. Chapel
(74) *Attorney, Agent, or Firm* — Sandberg Phoenix & von Gontard PC

(57) ABSTRACT

An infrared reflective and electrically conductive composite film to coat on a substrate, the composite film comprising at least one infrared reflective layer. The composite film further comprises at least one metal layer of connected metal nanowires, each of the at least one infrared reflective layer and at least one metal layer being conformably covered by an optically transparent conductive layer.

17 Claims, 3 Drawing Sheets

(56) References Cited

U.S. PATENT DOCUMENTS

| | | | |
|---|---|---|---|
| 2015/0183301 A1 | 7/2015 | Diguet et al. | |
| 2015/0185382 A1 | 7/2015 | Leyder et al. | |
| 2015/0305166 A1 | 10/2015 | Fried et al. | |
| 2017/0043556 A1* | 2/2017 | Okazaki | B32B 17/06 |
| 2017/0145737 A1* | 5/2017 | Hasegawa | B32B 27/34 |

FOREIGN PATENT DOCUMENTS

| | | | | |
|---|---|---|---|---|
| JP | 2013077007 A | * | 4/2013 | G02B 5/208 |
| JP | 2013080221 A | * | 5/2013 | G02B 5/206 |
| JP | 2013080222 A | * | 5/2013 | G02B 5/208 |
| JP | 2013083974 A | * | 5/2013 | C03C 17/007 |
| JP | 2013228694 A | * | 11/2013 | B32B 9/041 |
| WO | 2013056242 A1 | | 4/2013 | |
| WO | 2016031489 A1 | | 3/2016 | |

OTHER PUBLICATIONS

Schilling, etal; Percolation in Supensions of Hard Nanoparticles: From Spheres to Needles; Europhysics Letters: A Letters Journal Exploring the Frontiers of Physics, vol. 111, No. 5, Sep. 1, 2015, pp. 1-12.

\* cited by examiner

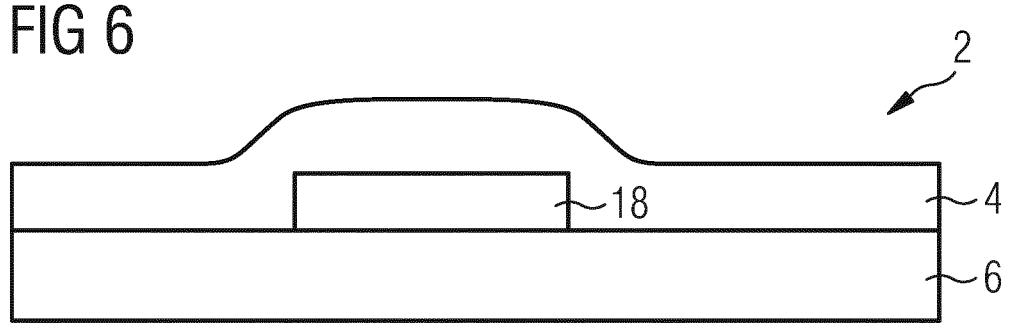

INFRARED REFLECTIVE AND ELECTRICAL CONDUCTIVE COMPOSITE FILM AND MANUFACTURING METHOD THEREOF

CROSS-REFERENCE TO RELATED APPLICATIONS

The present invention is the US national stage under 35 U.S.C. § 371 of International Application No. PCT/EP2018/050479, which was filed on Jan. 9, 2018, and which claims the priority of application LU 100018 filed on Jan. 11, 2017, the content of which (text, drawings and claims) are incorporated here by reference in its entirety.

FIELD

The invention is directed to an optically transparent composite film combining heat reflective properties and electrical conductivity to coat on a substrate, in various instances on an optically transparent substrate.

BACKGROUND

Infrared reflective and electrically conductive coatings on glass substrate are used to reduce heat transfer through the substrate and provide resistive heating for defogging and/or defrosting. The coatings are used in particular in the building and automotive glazing domains.

Current requirements for infrared reflective and conductive coatings for glazing, in particular in the automotive industry, are very strict, combining low heat transmission given by a high infrared reflection, high optical transmission, low electrical resistance, given by the sheet resistance of the coating, and good visual aspect which is defined by the reflected colour.

Current technologies are however reaching their physical limits and are not able to meet new requirements in terms of better energy management and/or delivering higher heating power with moderate applied voltage.

Prior art patent document published US 2011/0268941 A1 discloses a process for manufacturing a glazing unit with 3 or 4 functional layers made of silver that can act on solar radiation and/or infrared radiation, as well as resistive heater. One objective is to provide a multilayer that has a low surface resistivity, a high light transmission and a relatively neutral colour, and that can undergo a heat treatment above 600° C. without significant change of the properties. The glazing unit comprises a laminated structure. The glazing unit comprises a transparent glass substrate coated with a composite film comprising an alteration of one functional layer based on silver or metal alloy containing silver and positioned between two antireflection coatings. The coatings are deposited on the substrate by the vacuum technique. The composite film can be used to form heated glazing unit. The limitation of the structure is the absence of versatility on the visual aspect, particularly on the reflected colour. Moreover, the requirement to be able to undergo a heat treatment above 600° C. makes the structure complex and difficult to modify as a function of new requirements from the customer.

Prior art patent document published US 2015/0185382 A1 discloses a transparent infrared reflective and low emissivity composite film. The composite film is configured to be coated on a transparent substrate and comprises at least one silver based layer which provides infrared reflective (IRR) properties, at least one metal based layer and at least one metal oxide based layers and an atomic layer deposited (ALD) metal oxide layer on the top of the composite film. The composite film does not provide any electrical conductivity to the composite and does not reach good optical properties.

Prior art patent document published US 2015/0183301 A1 discloses an optically transparent and infrared reflecting (IRR) composite film. The composite film is configured to be coated on a glass substrate. The film comprises at least one metal based layer, at least one silver based layer used to reflect infrared radiation and at least one metal oxide based layer. The composite film does not provide any electrical conductivity to the composite and does not reach good optical properties.

The cited prior art disclosed composite films that show a limited figure of merit in terms of low heat transmission, high optical transmission, low electrical resistance and well defined colour.

The cited prior art discloses composite films that are deposited by vacuum technology, mainly sputtering, on flat substrates prior to high temperature treatment. The disclosed composite films are complex and contain a lot of layers in order to be able to stand additional processing steps, including high temperature heating and in order to reach good infrared reflective and optical properties and/or electrical conductive properties. Moreover, the process described in this prior art allows only very low versatility for changing the visual parameters of the resulting films.

SUMMARY

The invention has for technical problem to provide a solution which overcomes at least one drawback of the cited prior art. More particularly, the invention has for technical problem to provide an optically transparent composite film, to coat on a substrate, comprising a simple structure and which reaches improved optical transmission, infrared reflection and electrical conductive properties, while allowing larger flexibility in terms of visual aspect, in particular reflected colour.

The invention has also for technical problem to provide a method for the realization of a product coated with a composite film combining heat reflective, electrical conductivity and good optical properties.

The invention is directed to an infrared reflective and electrically conductive composite film to coat or to be applied or to deposit on a substrate, the composite film comprising at least one infrared reflective layer; remarkable in that the composite film further comprises at least one metal layer of connected metal nanowires, each of the at least one infrared reflective layer and at least one metal layer being conformably covered by an optically transparent conductive layer.

According to various embodiments, the at least one infrared reflective layer has a surface coverage rate of at least 30%.

According to various embodiments, the at least one infrared reflective layer is a layer of silver nanostructured particles with irregular shape or disk shape and/or the metal nanowires are silver nanowires.

According to various embodiments, the nanostructured particles of the at least one infrared reflective layer are separated from each other with a gap inferior to 1 μm, for example inferior to 100 nm.

According to various embodiments, the nanostructured particles of the at least one infrared reflective layer have different aspect ratio.

According to various embodiments, the nanostructured particles of the at least one infrared reflective layer have an average diameter comprised between 1 nm and 10 µm, for example between 10 nm and 1 µm.

According to various embodiments, the at least one infrared reflective layer has a thickness comprised between 1 nm and 30 nm.

According to various embodiments, the connected metal nanowires of the metal layer or each of the metal layer have a surface coverage rate inferior to 20%, for example inferior to 10%.

According to various embodiments, the connected metal nanowires have a length superior to 100 nm, for example superior to 10 µm, a width inferior to 10 µm, for example inferior to 100 nm and/or a thickness inferior to 300 nm, for example inferior to 100 nm.

According to various embodiments, each transparent conductive layer is an optically transparent conductive metal oxide.

According to various embodiments, each transparent conductive layer has a thickness comprised between 10 and 1000 nm.

According to various embodiments, the composite film further comprises at least one wetting layer, the wetting layer or each wetting layer being coated by an infrared reflective layer or by a metal layer.

According to various embodiments, the wetting layer or each wetting layer has a thickness inferior to 10 nm.

According to various embodiments, the composite film comprised between 1 and 5 infrared reflective layers and between 1 and 3 metal layers.

The invention is also directed to a method for producing a product comprising the steps of providing a substrate, depositing a composite film on the substrate, remarkable in that the composite film of step of depositing a composite film comprises at least one infrared reflective layer and at least one metal layer of connected metal nanowires, each of the at least one infrared reflective layer and at least one metal layer being conformably covered by an optically transparent conductive layer, the composite film being in accordance with the invention.

According to various embodiments, the method further comprises a step of depositing electrical contacts on the substrate.

According to various embodiments, in step of depositing electrical contacts on the substrate, the electrical contacts are deposited on the substrate before the composite film or before at least one infrared reflective layer or at least one metal layer.

According to various embodiments, the step of depositing the composite film is performed by atomic layer deposition and spray deposition.

The invention is particularly interesting in that the composite film comprises at least one infrared reflective layer in various instances of nanostructures particles and at least one metal layer, each of the layers being conformably covered by a transparent conducting layer. The configuration of the composite film according to the invention provides good infrared reflection and electrical conductive properties to the composite film while keeping a good optical transparency of the composite film and thus the optical transparency of the substrate.

Moreover, the invention provides a higher flexibility of the resulting visual aspect, as compared to the prior art, due to the partial decoupling of the infrared reflective layers and the electrical conductive layers, while keeping a high level of performances due to the synergistical electrical conduction provided by the transparent conductive layers.

Due to the method described in the invention for providing the afore-mentioned layers with a high degree of accuracy of the thickness on bended substrates, the number of layers can be reduced compared to composite film of the prior art with the same level of performances.

DRAWINGS

FIG. 6 illustrates a cross section of the product of FIG. 1 comprising electrical contacts, in accordance with various embodiments of the present disclosure.

DETAILED DESCRIPTION

In the following description, the term "optically transparent" is used to mean that a material or a device transmits at least 40%, for example at least 70%, in various instances at least 90%, of the incident visible light.

Figure 1:
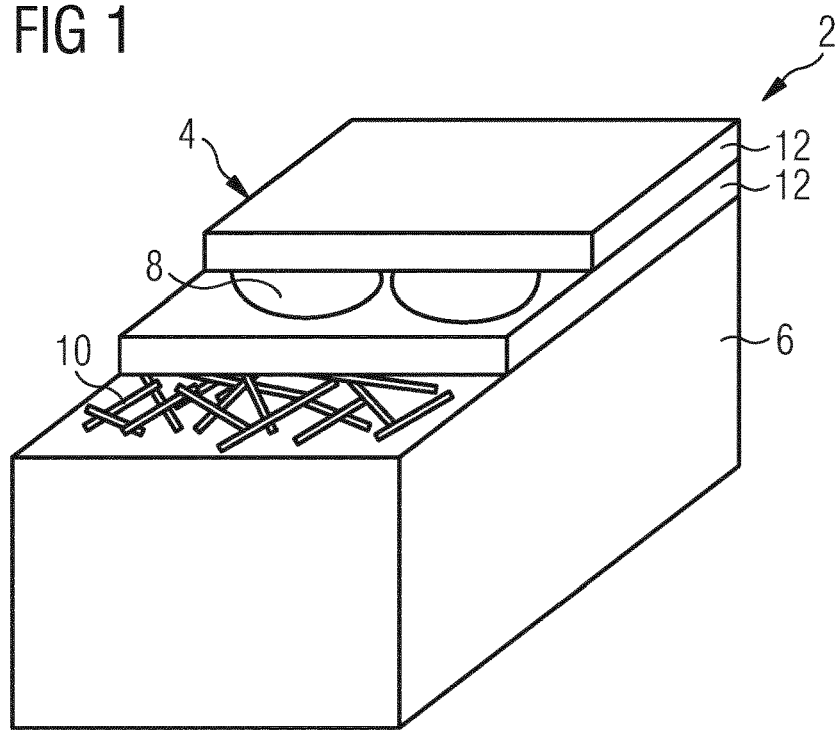
FIG. 1 illustrates a product comprising a composite film according to various embodiments of the present invention.
Figure 2:
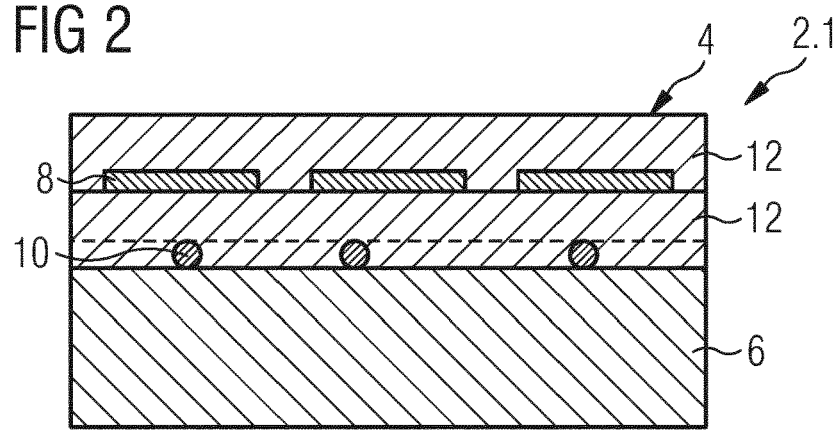
FIG. 2 is a cross section of the product represented on FIG. 1, according to a first exemplary embodiment.
Figure 3:
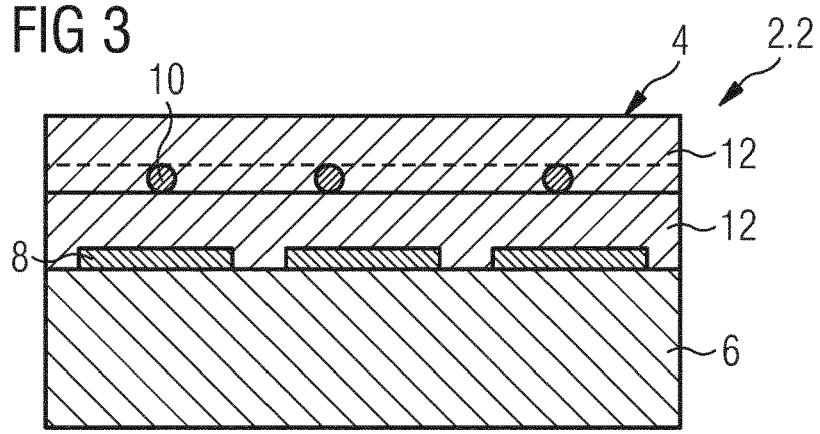
FIG. 3 is a cross section of the product represented on FIG. 1, according to a second exemplary embodiment.
Figure 4:
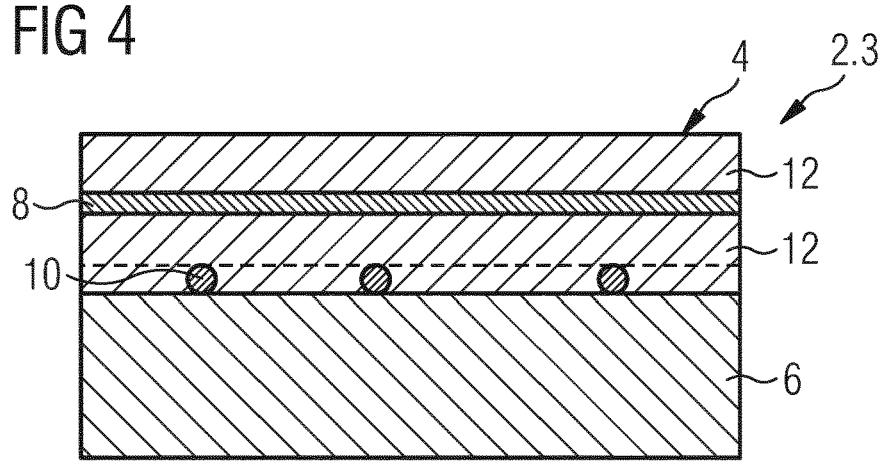
FIG. 4 is a cross section of the product represented on FIG. 1, according to a third exemplary embodiment.

FIG. 1 illustrates a product 2 comprising a composite film 4. FIG. 2, FIG. 3 and FIG. 4 respectively represent a cross section of the product 2 of FIG. 1 according to different exemplary embodiments. The products of FIGS. 2, 3 and 4 are respectively numbered 2.1, 2.2 and 2.3. The product 2 is in various instances optically transparent and comprises a substrate 6 and the composite film 4 coated on the substrate. Advantageously, the substrate 6 is optically transparent and is made of glass, PET or any optically transparent material. The substrate 6 can be for example a windshield or a window. The composite film 4 is coated on one face of the substrate but can be coated on more faces of the substrate.

The composite film 4 comprises at least one infrared reflective layer 8 and at least one metal layer 10 of connected metal nanowires. Each of the at least one infrared reflective layer 8 and the at least one metal layer 10 is conformably coated by an optically transparent conductive layer 12. The term "conformably" is used to mean that the transparent conductive layers cover/fit closely to the at least one infrared reflective layer and the at least one metal layer by adapting to the shape of the at least one infrared reflective layer and the at least one metal layer.

FIG. 1 only shows one infrared reflective layer 8 and one metal layer 10. In various instances, the composite film 4 comprises between 1 and 5 infrared reflective layers 8 and between 1 and 3 metal layers 10.

The at least one infrared reflective layer 8 has a surface coverage rate of at least 30%. The at least one infrared reflective layer 8 is advantageously a layer of nanostructured particles, as represented in FIGS. 1, 2 and 3. The nanostructured particles are advantageously flat silver nanoparticles with an irregular shape or with a disk shape. Preferentially, the nanoparticles are nanodisks. The term "nanodisk" is well-known by a skilled-man. The term "irregular" is used to describe nanoparticles whose contour does not form a perfect circle or disk. The nanostructured particles have an average diameter comprised between 1 nm and 10 µm, for example between 10 nm and 1 µm. The nanostructured particles of the at least one infrared reflective layer 8 are separated from each other with a gap inferior to 10 µm, for example inferior to 100 nm.

The nanostructured particles of the at least one infrared reflective layer 8 have different aspect ratio and different surface coverage. In each of the at least one infrared reflective layer 8, the nanostructured particles cover different regions of the layer for larger reflection spectrum. The nanostructured particles are advantageously atomic layer deposited nanostructured particles, but not limited to it.

The connected metal nanowires of the at least one metal layer 10 have a surface coverage rate inferior to 20%, for example inferior to 10%.

The connected metal nanowires of the at least one metal layer 10 are in various instances connected silver nanowires. The connected nanowires can form a disordered network of nanowires as represented in FIG. 1 or can be in the form of a metal nanogrid (not represented). The connected metal nanowires have a width inferior to 10 µm, for example inferior to 100 nm and a thickness inferior to 300 nm, for example inferior to 100 nm. The width and the thickness of the nanowires are respectively related to a plane parallel to an average plane of the substrate and to a plane transversal to an average plane of the substrate. The connected metal nanowires have a length superior to 100 nm, for example superior to 10 µm. In case of a nanogrid, the connected metal nanowires form a network with a length between connexions superior to 100 nm, for example superior to 1 µm. In case of a disordered network of nanowires, the length between the connexions is inferior to the length of the nanowires. The connected nanowires can be deposited by spray-deposition. The metal grid can be a mesh realised by lithography or by dewetting of a metal layer. The use of connected metal nanowires allows to provide an electrical conductive layer in the composite film 4 while keeping a good optical transparency of the layer.

Each transparent conductive layer 12 conformably covers the nanostructured particles of the at least one infrared reflective layer 8 and the connected metal nanowires of the at least one metal layer 10, in order to form a flattened surface. In order to reach the conformably covering of the layers 8 and 10, the transparent conductive layers 12 are advantageously deposited by Atomic Layer Deposition (ALD) but not limited to it. Each transparent conductive layer 12 is a layer of an optically transparent conductive material, preferentially transparent conductive metal oxide such as but not limited to Al-doped ZnO layer or tin oxide.

Each transparent conductive layer 12 has a thickness comprised between 10 and 1 µm. Each transparent conductive layer 12 have different thickness, or have the same thickness.

The combination of at least one infrared layer and at least one metal layer of connected metal nanowires, with conformal transparent conductive layers provides a solution to obtain optimum infrared reflective and electrical resistance properties of the composite film 4, while keeping good optical properties of the composite film in terms of optical transmission and visual aspect.

The presence of several infrared reflective layers 8 with nanostructured particles of different aspect ratios allows to improve the surface coverage of the nanostructured particles in the composite film, thus improving the infrared reflective properties of the composite film, while maintaining a good optical transparency of the composite film.

As represented in FIGS. 1 and 2, the infrared reflective layer 8 is under the metal layer 10, the configuration does not limit the invention. Indeed, the metal layer 10 can also be above the infrared reflective layer 8, as represented in FIG. 3. The terms "above" and "under" are related to the substrate. In case of more than one metal layer 10 and more than one infrared reflective layer 8, many configurations of the composite film 4 are possible. One or several infrared reflective layers 8 can be made of disconnected nanoparticles as represented in FIGS. 1, 2 and 3, or of a continuous metal film corresponding to a surface coverage of 100%, as represented in FIG. 4.

The composite film 4 can also comprise at least one wetting layer (not represented). The wetting layer or each wetting layer is coated by an infrared reflective layer 8 or a metal layer 10. The at least one wetting layer promotes deposition of an infrared reflective layer 8 and/or of a metal layer 10. The wetting layer can be made of metal or oxide or nitride or sulfide layer or a combination. In various instances, the at least one wetting layer is made of silver. The at least one wetting layer has a thickness inferior to 10 nm. The composite film 4 can also comprise supplementary layers such as supplementary transparent conductive layers 12, protective insulating layers, anti-reflecting layers or index matching layers, gas barrier layers and/or haze reducing layers (not represented).

Figure 5:
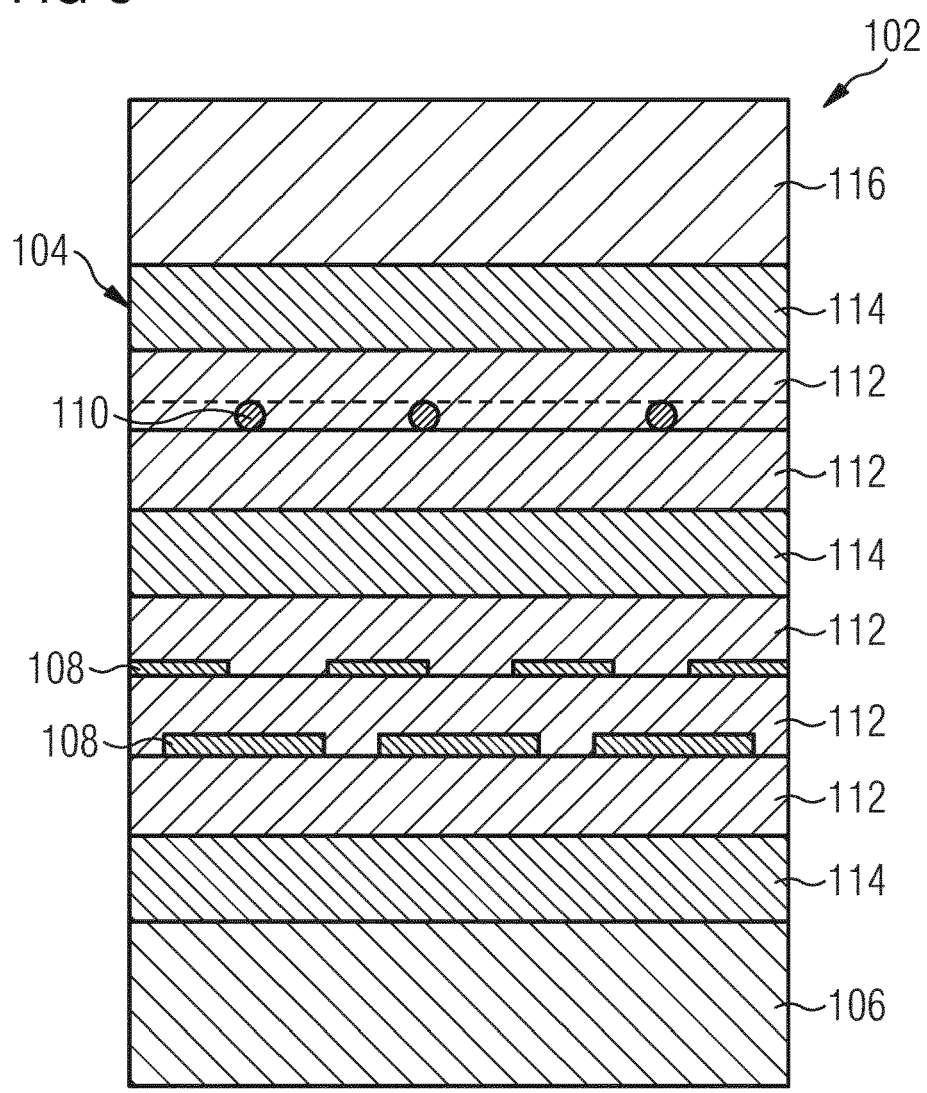
FIG. 5 illustrates a cross section of an example of a full optically transparent product comprising the composite film and optional layers, in accordance with various embodiments of the invention.

FIG. 5 illustrates an example of a product coated with the composite film according to the invention comprising optional additional layers. This example does not restrict any other configuration. The product 102 is a full optically transparent product. The product 102 comprised a substrate 106 which is coated with a composite film 104. The composite film 104 comprises two infrared reflective layers 108 and one metal layer 110, each of the layers 108 and 110 being conformably coated with a transparent conductive layer 112. The composite film 104 can also comprise others transparent conductive layers 112. More particularly, a transparent conductive layer 112 can be coated on the substrate 106 before deposition of the at least one infrared reflective layers 108 or the at least one metal layer 110. The composite film 104 can also comprise optical or barrier layers 114 and a protection layer 116 on the top of the composite film 104, at the opposite side of the substrate 106.

Generally, the product 2 coated with a composite film 4 according to the invention, can also comprise electric contacts 18, as illustrated in FIG. 6. The electrical contacts 18 are deposited on the substrate 6 before the deposition of the composite film 4 on the substrate, or at least before one of the infrared reflective layer or one metal layer. In case of a bended substrate, as a car windshield, the composite film or at least part of the composite film is deposited after the bending of the substrate. The composite film, being mostly deposited by atomic layer deposition, allows to have a direct electrical connection between the electrical contacts and the composite film. The combination of electrical contacts with the composite film provide defogging and defrosting properties to the product.

The manufacturing described here does not preclude post thermal treatment at a moderate temperature below 300° C.

In other exemplary embodiments of the invention (not represented), the product comprising a glass substrate coated with the composite film according to the invention can also comprise a polymer film such as a polyvinyl butyral film and a counter substrate glass, in order to form a laminated glass.

The composite film according to the invention can be used to produce low-emissivity windows, glazing in vehicle such as cars, planes or trains, glass for displays and/or transparent polymer substrate (e.g. helmet's eyeshade), all of them can be flat or bended.

The invention claimed is:

1. A product comprising a substrate and an infrared reflective and electrically conductive composite film coated on the substrate, said composite film comprising:
   at least one infrared reflective layer conformably covered by an optically transparent conductive layer;
   at least one metal layer of connected metal nanowires conformably covered by an optically transparent conductive layer; and
   electrical contacts deposited on the substrate and in direct electrical contact with the composite film.

2. The product according to claim 1, wherein:
   the at least one infrared reflective layer is a layer of disk-shaped silver nanostructured particles, and
   the metal nanowires are silver nanowires.

3. The product according to claim 2, wherein the at least one infrared reflective layer has a surface coverage rate of at least 30%.

4. The product according to claim 3, wherein the nanostructured particles of the at least one infrared reflective layer are separated from each other with a gap inferior to 1 µm.

5. The product according to claim 3, wherein the nanostructured particles of the at least one infrared reflective layer have different aspect ratios.

6. The product according to claim 3, wherein the nanostructured particles of the at least one infrared reflective layer have an average diameter comprised between 1 nm and 10 µm.

7. The product according to claim 1, wherein the at least one infrared reflective layer has a thickness comprised between 1 nm and 30 nm.

8. The product according to claim 1, wherein the connected metal nanowires of the metal layer or each of the metal layers have a surface coverage rate inferior to 20%.

9. The product according to claim 1, wherein the connected metal nanowires have at least one of a length superior to 100 nm, a width inferior to 10 µm and a thickness inferior to 300 nm.

10. The product according to claim 1, wherein each transparent conductive layer is an optically transparent conductive metal oxide.

11. The product according to claim 1, wherein each transparent conductive layer has a thickness comprised between 10 and 1000 nm.

12. The product according to claim 1, wherein the composite film further comprises at least one wetting layer, each wetting layer being coated by an infrared reflective layer or by a metal layer.

13. The product according to claim 12, wherein each wetting layer has a thickness inferior to 10 nm.

14. The product according to claim 1, wherein the composite film comprises between 1 and 5 infrared reflective layers and between 1 and 3 metal layers.

15. A method for producing a product comprising the steps of:
   providing a substrate; and
   depositing a composite film on the substrate,
   wherein the composite film comprises at least one infrared reflective layer conformably covered by an optically transparent conductive layer, at least one metal layer of connected metal nanowires conformably covered by an optically transparent conductive layer; and
   depositing electrical contacts on the substrate and in direct electrical contact with the composite film.

16. The method according to claim 15, wherein, in step of depositing electrical contacts on the substrate, the electrical contacts are deposited on the substrate before at least one of the composite film, the at least one infrared reflective layer, and the at least one metal layer.

17. The method according to claim 15, wherein the step of depositing the composite film is performed by atomic layer deposition and spray deposition.

* * * * *